United States Patent
Hojo et al.

(10) Patent No.: US 7,830,736 B2
(45) Date of Patent: Nov. 9, 2010

(54) SEMICONDUCTOR INTEGRATED CIRCUIT DEVICE AND REDUNDANCY METHOD THEREOF

(75) Inventors: Takehiko Hojo, Yokohama (JP); Tomohiro Kobayashi, Kawasaki (JP); Tetsuya Amano, Funabashi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 12/165,720

(22) Filed: Jul. 1, 2008

(65) Prior Publication Data
US 2009/0010085 A1    Jan. 8, 2009

(30) Foreign Application Priority Data
Jul. 4, 2007    (JP) .............................. 2007-176550

(51) Int. Cl.
G11C 29/00    (2006.01)

(52) U.S. Cl. .................. 365/200; 365/63; 365/225.7; 365/189.07; 365/189.08

(58) Field of Classification Search ................ 365/200, 365/225.7, 63, 189.07, 189.08
See application file for complete search history.

(56) References Cited

U.S. PATENT DOCUMENTS

| | | | |
|---|---|---|---|
| 5,341,267 A | | 8/1994 | Whitten et al. |
| 5,444,287 A | | 8/1995 | Bezama et al. |
| 5,621,691 A | * | 4/1997 | Park ........................... 365/200 |
| 5,959,445 A | * | 9/1999 | Denham ...................... 323/315 |
| 6,246,617 B1 | * | 6/2001 | Urakawa ..................... 365/200 |
| 6,477,072 B2 | * | 11/2002 | Shimizu et al. ................ 365/51 |
| 6,498,526 B2 | * | 12/2002 | Lim et al. .................... 327/525 |
| 6,879,021 B1 | * | 4/2005 | Fitfield et al. ................. 257/530 |
| 6,906,557 B1 | * | 6/2005 | Parker et al. ................... 327/53 |
| 7,012,827 B2 | * | 3/2006 | Chung .......................... 365/94 |
| 7,102,951 B2 | * | 9/2006 | Paillet et al. .............. 365/225.7 |
| 7,203,117 B2 | * | 4/2007 | Agata et al. .............. 365/225.7 |
| 7,215,175 B1 | * | 5/2007 | Mandal et al. ............... 327/525 |
| 7,271,644 B2 | * | 9/2007 | Lin et al. ..................... 327/525 |
| 7,307,864 B2 | * | 12/2007 | Kohara ......................... 365/96 |
| 7,459,956 B2 | * | 12/2008 | Chung et al. ................. 327/525 |
| 7,495,310 B2 | * | 2/2009 | Douzaka et al. ............. 257/529 |
| 7,538,369 B2 | * | 5/2009 | Kushiyama ................. 257/209 |
| 2006/0197178 A1 | | 9/2006 | Chung |

FOREIGN PATENT DOCUMENTS

| | | | |
|---|---|---|---|
| JP | 09-007385 | | 1/1997 |
| JP | EP-881573 A1 | * | 12/1998 |
| JP | 2001-118996 | | 4/2001 |
| JP | 2001118996 A | * | 4/2007 |

* cited by examiner

*Primary Examiner*—Viet Q Nguyen
(74) *Attorney, Agent, or Firm*—Turocy & Watson, LLP (57) ABSTRACT

A semiconductor integrated circuit device includes a first fuse circuit, a second fuse circuit, and a control signal generating circuit which sends a first control signal and executes program such that the resistance value of the first fuse circuit becomes greater than the resistance value of the second fuse circuit, and sends a second control signal and executes reprogram such that the resistance value of the second fuse circuit becomes greater than the resistance value of the first fuse circuit.

7 Claims, 13 Drawing Sheets e fuse 10 (1st program time)

(Resistance values at 1st program time : R2 < R1)

(Resistance values in initial state : R2>R1)

FIG. 1

First embodiment

|  | Resistance ratio (R1:R2) | W size ratio (N3:N4) | Output data |
|---|---|---|---|
| Initial state | 1 : 3 | 1 : 1 | "0" |
| 1st program time | 6 : 3 | 1 : 1 | "1" ⇒ inversion |
| 2nd program time | 6 : 12 | 1 : 1 | "0" ⇒ re-inversion |

Second embodiment

| | Resistance ratio (R1:R2) | W size ratio (N3:N4) | Output data |
|---|---|---|---|
| Initial state | 1 : 1 | 2 : 1 | "0" |
| 1st program time | 6 : 1 | 2 : 1 | "1" ⇒ inversion |
| 2nd program time | 6 : 12 | 2 : 1 | "0" ⇒ re-inversion |

SEMICONDUCTOR INTEGRATED CIRCUIT DEVICE AND REDUNDANCY METHOD THEREOF

CROSS-REFERENCE TO RELATED APPLICATIONS

This application is based upon and claims the benefit of priority from prior Japanese Patent Application No. 2007-176550, filed Jul. 4, 2007, the entire contents of which are incorporated herein by reference.

BACKGROUND OF THE INVENTION

1. Field of the Invention

The present invention relates to a semiconductor integrated circuit device and a redundancy method thereof. The invention is applied, for example, to an SRAM including a fuse box.

2. Description of the Related Art

Conventionally, there is known a semiconductor integrated circuit device wherein a blow-type fuse element, such as an eFuse, is used, and an electric current is caused to flow in the fuse element, thereby blowing the fuse element and programming data (see, e.g. Jpn. Pat. Appln. KOKAI Publication No. H9-7385 and Jpn. Pat. Appln. KOKAI Publication No. 2001-118996). For example, by blowing a fuse element, the resistance value of the programmed fuse element is more increased by an order of magnitude than the resistance value of the fuse element before programming.

In the case of using the blow-type fuse element, however, if program is once executed, the fuse element is broken, and rewrite of the associated bit is disabled. In a case where rewrite is necessary, a fuse element of a different bit is additionally prepared, and it is necessary to execute write in this different fuse element.

BRIEF SUMMARY OF THE INVENTION

According to an aspect of the present invention, there is provided a semiconductor integrated circuit device comprising: a first fuse circuit including a first fuse element and a first write transistor which has a current path with one end connected to one end of the first fuse element; a second fuse circuit including a second fuse element and a second write transistor which has a current path with one end connected to one end of the second fuse element, the second fuse circuit being configured such that a resistance value of the second fuse element is greater than a resistance value of the first fuse element and thereby a resistance value of the second fuse circuit is greater than a resistance value of the first fuse circuit; and a control signal generating circuit which sends a first control signal to a control terminal of the first write transistor and executes program such that the resistance value of the first fuse circuit becomes greater than the resistance value of the second fuse circuit, and sends a second control signal to a control terminal of the second write transistor and executes reprogram such that the resistance value of the second fuse circuit becomes greater than the resistance value of the first fuse circuit.

According to another aspect of the present invention, there is provided a semiconductor integrated circuit device comprising: a first fuse circuit including a first fuse element and a first read transistor which has a current path with one end connected to one end of the first fuse element; a second fuse circuit including a second fuse element and a second read transistor which has a current path with one end connected to one end of the second fuse element, the second fuse circuit being configured such that an ON resistance of the second read transistor is greater than an ON resistance of the first read transistor and thereby a resistance value of the second fuse circuit is greater than a resistance value of the first fuse circuit; and a control signal generating circuit which sends a first control signal to the first fuse circuit and executes program such that the resistance value of the first fuse circuit becomes greater than the resistance value of the second fuse circuit, and sends a second control signal to the second fuse circuit and executes reprogram such that the resistance value of the second fuse circuit becomes greater than the resistance value of the first fuse circuit.

According to still another aspect of the present invention, there is provided a redundancy method of a semiconductor integrated circuit, comprising: conducting a first wafer test as to whether a semiconductor integrated circuit, which is fabricated on a semiconductor wafer, functions normally or not; conducting first redundancy for replacing a defective cell, which is discovered in the first wafer test, with a redundancy cell in the semiconductor integrated circuit; conducting a second wafer test as to whether the semiconductor integrated circuit functions normally or not; performing assembly by dicing the semiconductor integrated circuit from the semiconductor wafer, and mounting the diced semiconductor integrated circuit on a board; conducting a first final test as to whether the mounted semiconductor integrated circuit functions normally or not; conducting second redundancy for replacing a defective cell, which is discovered in the first final test, with a redundancy cell in the semiconductor integrated circuit; and conducting a second final test as to whether the semiconductor integrated circuit functions normally or not.

DETAILED DESCRIPTION OF THE INVENTION

Embodiments of the present invention will now be described with reference to the accompanying drawings. In the description below, common parts are denoted by like reference numerals throughout the drawings.

First Embodiment

Figure 1:
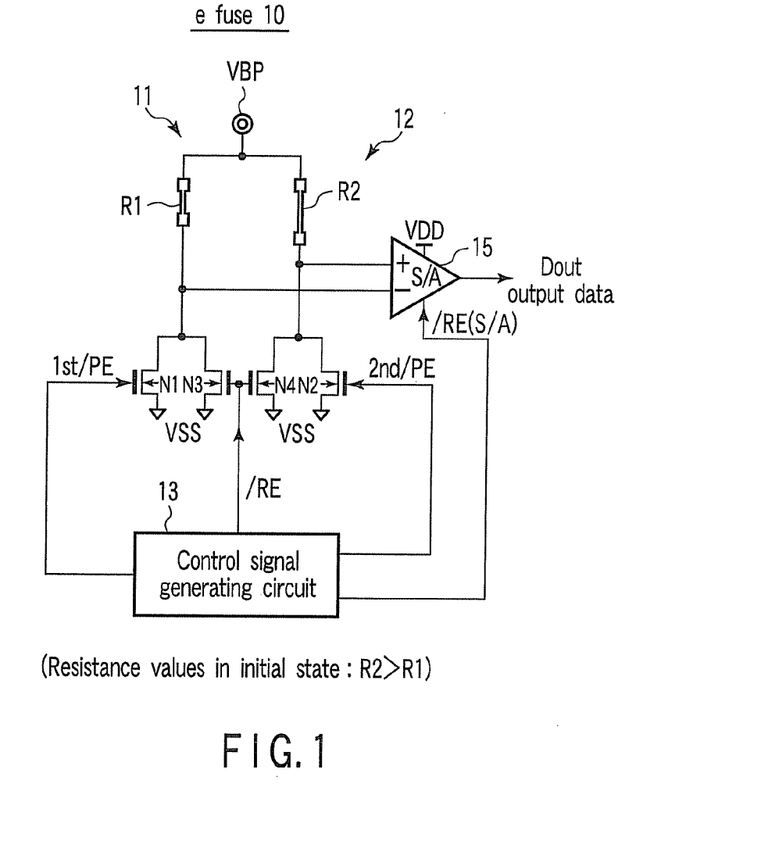
FIG. 1 is a circuit diagram showing a semiconductor integrated circuit device according to a first embodiment of the present invention.
Figure 2:
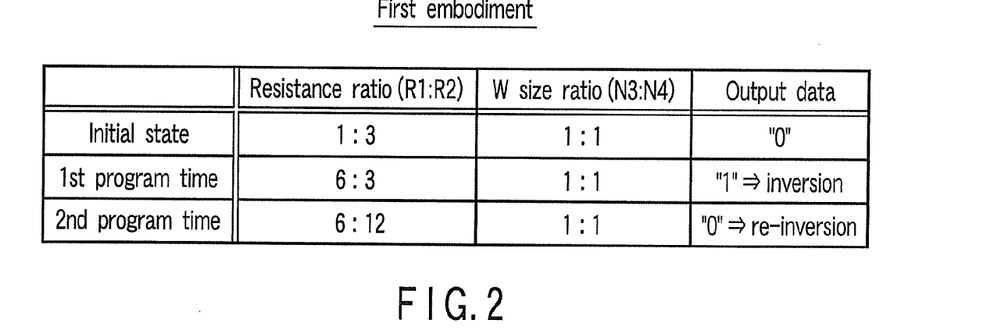
FIG. 2 is a view for explaining output data of the semiconductor integrated circuit device according to the first embodiment.

An Example in which a Large/Small Relationship is Present Between Resistance Values of Fuse Elements To begin with, referring to FIG. 1 and FIG. 2, a description is given of the structure of a semiconductor integrated circuit device according to a first embodiment of the present invention. This embodiment relates to an example in which a large/small relationship is present between resistance values of two fuse elements. In this embodiment, an efuse, which is electrically programmable by blowing a fuse element, is taken as an example of the fuse element.

<1. Structure Example>

As shown in FIG. 1, an eFuse 10 according to this embodiment comprises a first fuse circuit 11, a second fuse circuit 12, a sense amplifier 15 and a control signal generating circuit 13.

The first fuse circuit 11 includes a first fuse element R1, a first write transistor N1, and a first read transistor N3. The first fuse element R1 has one end connected to a program voltage node VBP. The first write transistor N1 has a source connected to an internal power supply voltage VSS, a drain connected to the other end of the first fuse element R1, and a gate to which a first control signal 1st/PE is input. The first read transistor N3 has a source connected to the internal power supply voltage VSS, a drain connected to the other end of the first fuse element R1, and a gate to which a read control signal /RE is input.

The second fuse circuit 12 includes a second fuse element R2, a second write transistor N2, and a second read transistor N4. The second fuse element R2 has one end connected to the program voltage node VBP. The second write transistor N2 has a source connected to the internal power supply voltage VSS, a drain connected to the other end of the second fuse element R2, and a gate to which a second control signal 2nd/PE is input. The second read transistor N4 has a source connected to the internal power supply voltage VSS, a drain connected to the other end of the second fuse element R2, and a gate to which the read control signal /RE is input.

In the case of the present embodiment, the length of the second fuse element R2 is set to be greater than the length of the first fuse element R1. On the other hand, the read transistors N3 and N4 have a substantially equal W size (gate width size) ratio (W side ratio=1:1). Thus, in the initial state, the resistance value of the second fuse element R2 is greater than the resistance value of the first fuse element R1 (the resistance values in the initial state: R1<R2), and thereby the resistance value of the second fuse circuit 12 is greater than the resistance value of the first fuse circuit 11. In addition, each of the first and second fuse elements R1 and R2 is a blow-type fuse element which is configured such that a high voltage is applied between both ends of the blow-type fuse element and thereby the blow-type fuse element is blown and can be programmed. For example, the blow-type fuse element is formed of polysilicon, or a metal such as copper (Cu) or aluminum (Al).

The sense amplifier 15 has a first input (positive (+) input) connected to the other end of the second fuse element R2, a second input (negative (−) input) connected to the first fuse element R1, and a control terminal connected to an internal power supply voltage VDD. The sense amplifier 15 outputs output data Dout of "0" data or "1" data. By this circuit configuration, the sense amplifier 15 reads a voltage difference between the fuse elements R1 and R2, and determines "1" or "0".

The control signal generating circuit 13 is configured to generate the first and second control signals 1st/PE and 2nd/PE, read control signal /RE and sense-amplifier read control signal /RE(S/A). In the case of the present embodiment, the first and second control signals are program enable signals /PE ("/" indicates "negation"), the read control signals are read enable signals /RE.

As will be described later, the control signal generating circuit 13 sends the first control signal 1st/PE to the gate of the first write transistor N1, blows the first fuse element R1, and executes control to carry out such program that the resistance value of the first fuse circuit 11 becomes greater than the resistance value of the second fuse circuit 12. Further, the control signal generating circuit 13 sends the second control signal 2nd/PE to the gate of the second write transistor N2, blows the second fuse element R2, and executes control to carry out such reprogram that the resistance value of the second fuse circuit 12 becomes greater than the resistance value of the first fuse circuit 11.

Thus, as shown in FIG. 2, even after the first fuse element R1 is programmed (1st program), the program voltage may be re-applied to the second fuse element R2 and thereby the second fuse element R2 can be reprogrammed (2nd program). Accordingly, by reversing twice the large/small relationship between the resistance values of the first and second fuse circuits 11 and 12, the output data Dout can be re-inverted ("0"→"1", "1"→"0"). In other words, by using the two electrically programmable first and second fuse elements R1 and R2, the program mode (medium resistance (1st program), high resistance (2nd program)) is selectively used, and data write can be executed up to twice. As has been described above, according to the above-described structure, the eFuse 10 of the same bit can be reprogrammed.

<2. Read Operation (Initial State)>

Figure 3:
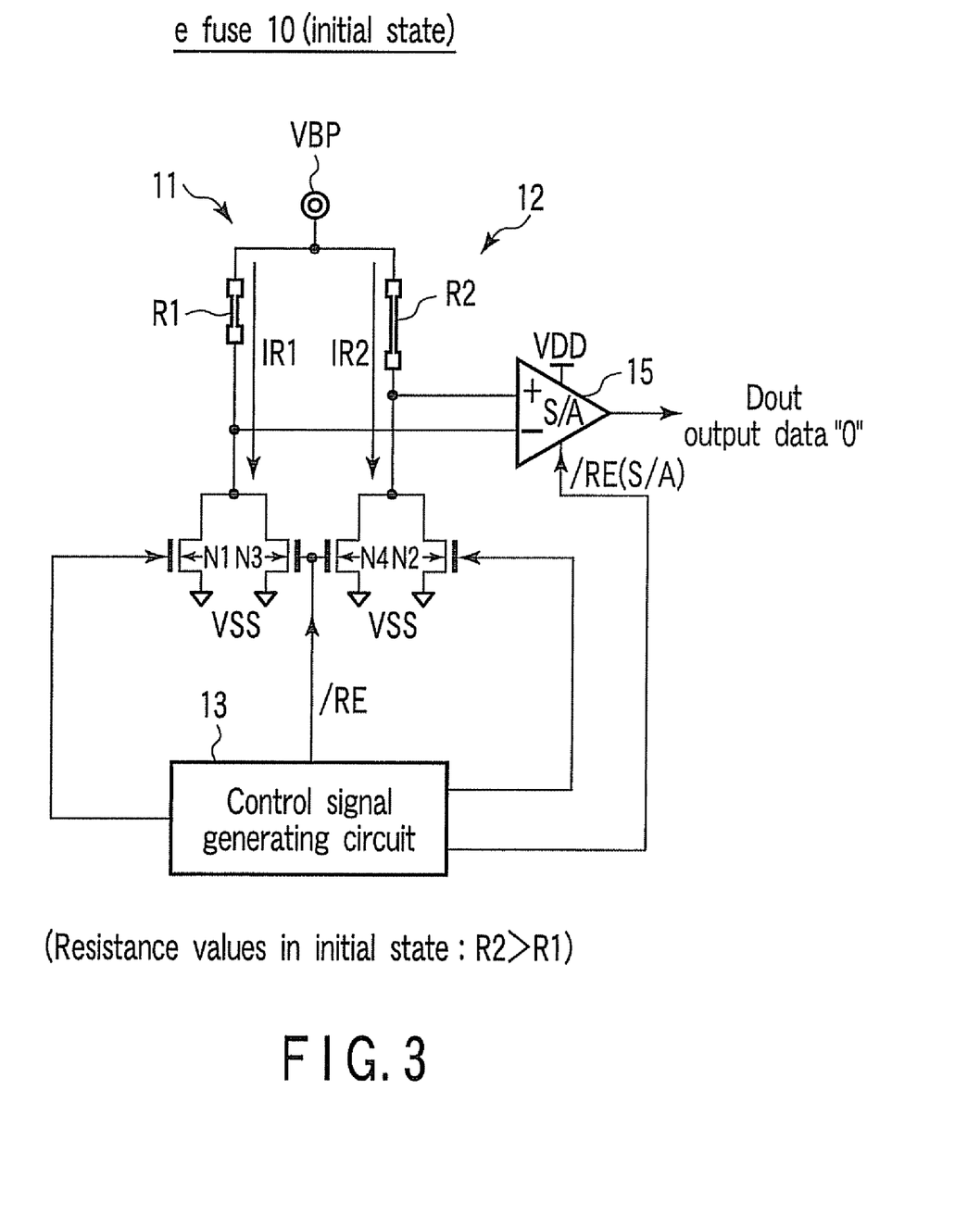
FIG. 3 is a view illustrating a read operation in an initial state of the semiconductor integrated circuit device according to the first embodiment.

Next, referring to FIG. 3, a description is given of the read operation of the eFuse 10 in the initial state according to the present embodiment. As shown in FIG. 3, in the initial state, the resistance value of the second fuse element R2 is set to be greater than the resistance value of the first fuse element R1 (resistance values: R2>R1). For example, in the initial state, the resistance value of the first fuse element R1 is about 100Ω, and the resistance value of the second fuse element R2 is about 200Ω. On the other hand, the read transistors N3 and N4 have a substantially equal W size ratio (W size ratio=1:1).

Accordingly, in the initial state, the resistance value of the second fuse circuit 12 is greater than the resistance value of the first fuse circuit 11.

To start with, the control signal generating circuit 13 outputs the read control signal /RE to the gates of the read transistors N3 and N4, thereby turning on the read transistors N3 and N4.

Then, read currents IR1 and IR2 are caused to flow across both ends of the first and second fuse elements R1 and R2, and the read currents IR1 and IR2 are input to the sense amplifier 15.

Subsequently, the sense amplifier 15 reads a voltage difference between the fuse elements R1 and R2 from the input read currents IR1 and IR2, and outputs the output data Dout of, for example, "0" data.

<3. Program Operation>

Figure 4:
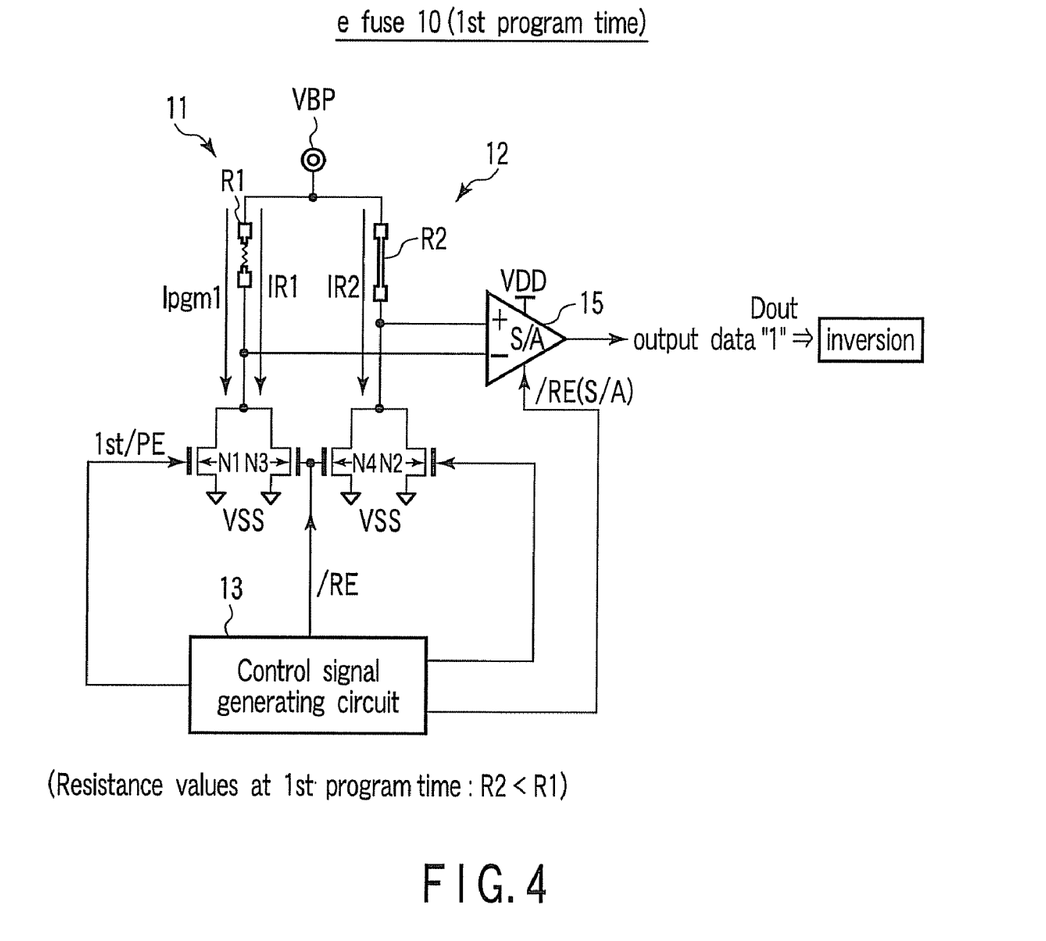
FIG. 4 is a view for explaining a first program time of the semiconductor integrated circuit device according to the first embodiment.
Figure 5:
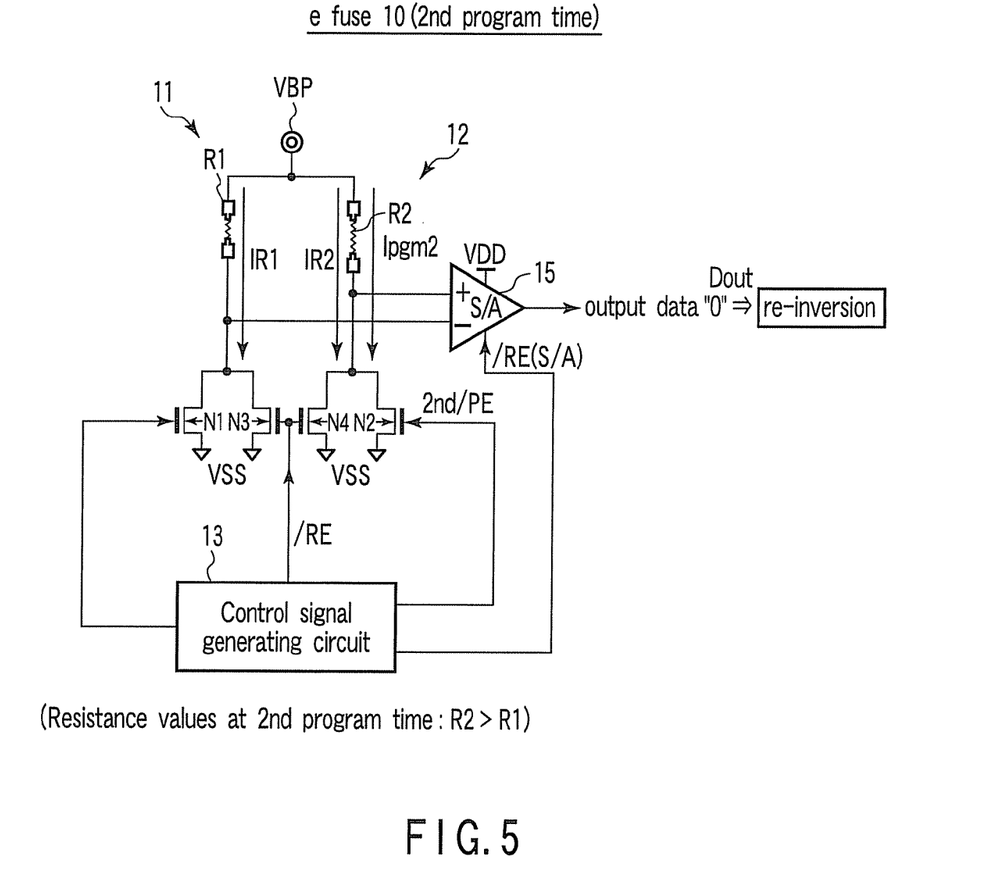
FIG. 5 is a view for explaining a second program time of the semiconductor integrated circuit device according to the first embodiment.

Next, referring to FIG. 4 and FIG. 5, a description is given of the program operation of the eFuse 10 in the initial state according to the present embodiment.

<3-1. First Program (1st Program) Operation>

To begin with, the first program (1st program) operation is described with reference to FIG. 4.

As shown in FIG. 4, to start with, the control signal generating circuit 13 sends the first control signal 1st/PE to the gate of the first write transistor N1, and turns on the first write transistor N1.

Then, the program voltage is applied to the program voltage node VBP, and the program voltage is applied across both ends of the first fuse element R1, thereby causing a program current Ipgm1 to flow, and blowing the first fuse element R1. Accordingly, at the 1st program time, the resistance value of the second fuse element R2 becomes less than the resistance value of the first fuse element R1 (resistance values: R2<R1). For example, at the 1st program time, the resistance value of the programmed first fuse element R1 is about several kΩ. In this manner, at the 1st program time, the control circuit 13 executes program such that the resistance value of the first fuse circuit 11 becomes greater than the resistance value of the second fuse circuit 12.

Subsequently, like the above-described read operation, the sense amplifier 15 reads a voltage difference between the fuse elements R1 and R2 from the read currents IR1 and IR2, and outputs the output data Dout of "1" data, which has been inverted from the initial state.

<3-2. Second Program (2nd Program) Operation>

Next, the second program (2nd program) operation is described with reference to FIG. 5.

As shown in FIG. 5, to start with, the control signal generating circuit 13 sends the second control signal 2nd/PE to the gate of the second write transistor N2, and turns on the second write transistor N2.

Then, the program voltage is applied to the program voltage node VBP, and the program voltage is applied across both ends of the second fuse element R2, thereby causing a program current Ipgm2 to flow, and blowing the second fuse element R2. Accordingly, at the 2nd program time, the resistance value of the second fuse element R2 becomes greater, once again, than the resistance value of the first fuse element R1 (resistance values: R2>R1). For example, at the 2nd program time, the resistance value of the programmed second fuse element R2 is about several-ten kΩ. In this manner, at the 2nd program time, the control circuit 13 can execute reprogram such that the resistance value of the second fuse circuit 12 becomes greater than the resistance value of the first fuse circuit 11.

Subsequently, like the above-described read operation, the sense amplifier 15 reads a voltage difference between the fuse elements R1 and R2 from the read currents IR1 and IR2, and outputs the output data Dout of "0" data, which has been inverted from the state of the 1st program time.

<4. Advantageous Effects of First Embodiment>

According to the semiconductor integrated circuit device of the first embodiment, at least the following advantageous effects (1) and (2) can be obtained.

(1) Reprogram can be executed for the same bit, and the usability is improved.

As has been described above, the control signal generating circuit 13 sends the first control signal 1st/PE to the gate of the first write transistor N1, blows the first fuse element R1, and executes control to carry out such program that the resistance value of the first fuse circuit 11 becomes higher than the resistance value of the second fuse circuit 12. Further, the control signal generating circuit 13 sends the second control signal 2nd/PE to the gate of the second write transistor N2, blows the second fuse element R2, and executes control to carry out such reprogram that the resistance value of the second fuse circuit 12 becomes higher than the resistance value of the first fuse circuit 11.

Thus, as shown in FIG. 2, even after the first fuse element R1 is programmed (1st program), the program voltage may be re-applied to the second fuse element R2 and thereby the second fuse element R2 can be reprogrammed (2nd program). Accordingly, by reversing twice the large/small relationship between the resistance values of the first and second fuse elements R1 and R2, the output data Dout can be re-inverted ("0"→"1", "1"→"0"). In other words, by using the two electrically programmable first and second fuse elements R1 and R2, the program mode (medium resistance (1st program), high resistance (2nd program)) is selectively used, and data write can be executed up to twice.

In this manner, according to the above-described structure, the eFuse 10 of the same bit can be reprogrammed, and the usability can be improved.

Assume now that the eFuse 10 according to the present embodiment is applied as a redundancy memory of an SRAM (Static Random Access Memory), for example, as will be described in connection with a third embodiment of the invention. In this case, even if redundancy is once executed in a wafer test (i.e. program is once executed for the eFuse 10), redundancy can be executed once again for a defective cell which is discovered in a final test (i.e. reprogram is executed for the same eFuse (i.e. the same bit)), and therefore the yield of SRAMs can be improved.

(2) The manufacturing cost can advantageously be reduced.

As has been described above, the first and second fuse circuits 11 and 12 have mirror-symmetry structures with respect to a line connecting the program voltage node VBP and the node to which the read control signal /RE is input, except for the lengths of the fuse elements R1 and R2. Therefore, when the transistors N1 to N4 are fabricated, the number of photomasks can be decreased, and the manufacturing cost of the first and second fuse circuits 11 and 12 can be reduced.

Thus, according to the present embodiment, the manufacturing cost can advantageously be reduced.

Second Embodiment

An Example in which a Large/Small Relationship is Present Between ON Resistance Values of Read Transistors Next, a semiconductor memory device according to a second embodiment of the invention is described with reference to FIG. 6 to FIG. 10. This embodiment relates to an example in which a large/small relationship is present between ON resistance values of read transistors N3 and N4. A detailed description of the parts, which are common to those in the first embodiment, is omitted.

<Structure Example>

Figure 6:
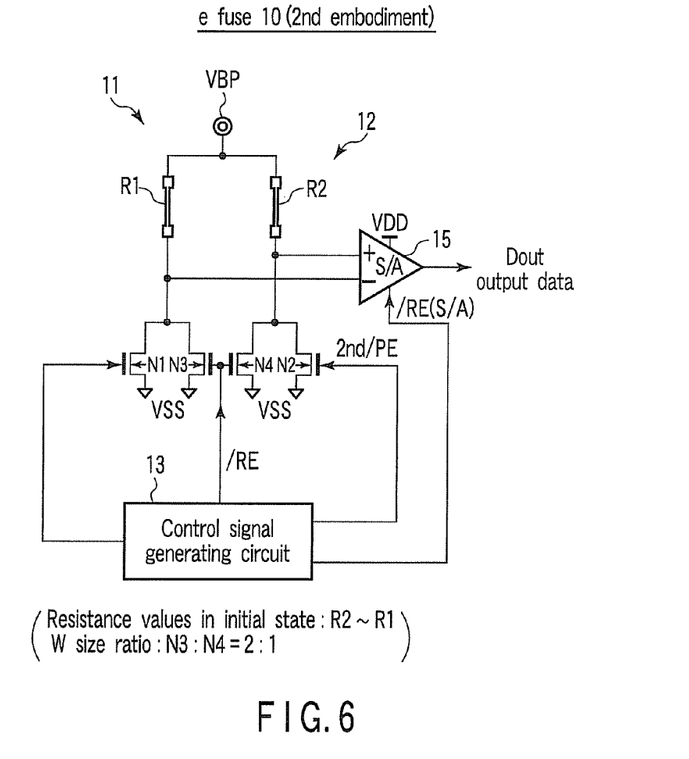
FIG. 6 is a circuit diagram showing a semiconductor integrated circuit device according to a second embodiment of the present invention.
Figure 7:
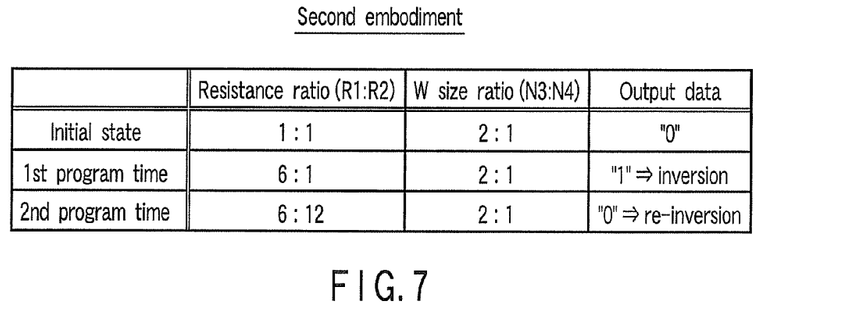
FIG. 7 is a view for explaining output data of the semiconductor integrated circuit device according to the second embodiment.

The structure of this embodiment is described with reference to FIG. 6 and FIG. 7. As shown in FIG. 6 and FIG. 7, an eFuse 10 of this embodiment differs from that of the first embodiment with respect to the following respects.

In the case of the present embodiment, the W size ratio of the read transistors N3 and N4 is set at 2:1 (W size ratio). Accordingly, the ON resistance of the second read transistor N4 is greater than the ON resistance of the first read transistor N3. On the other hand, since the first and second fuse elements R1 and R2 have substantially equal lengths, the resistance values of the fuse elements R1 and R2 in the initial state are substantially equal (resistance values: R1=R2).

Thus, in the initial state, the ON resistance of the second read transistor N4 is greater than the ON resistance of the first read transistor N3, and thereby the resistance value of the second fuse circuit 12 is greater than the resistance value of the first fuse circuit 11.

As described above, the structure of the present embodiment differs from that of the first embodiment in that the first and second fuse elements R1 and R2 have the same fuse size, while the dimensions of the read transistors N3 and N4 (W size ratio) are unbalanced, thereby causing a voltage difference which is input to the sense amplifier 15.

<Read Operation (Initial State)>

Figure 8:
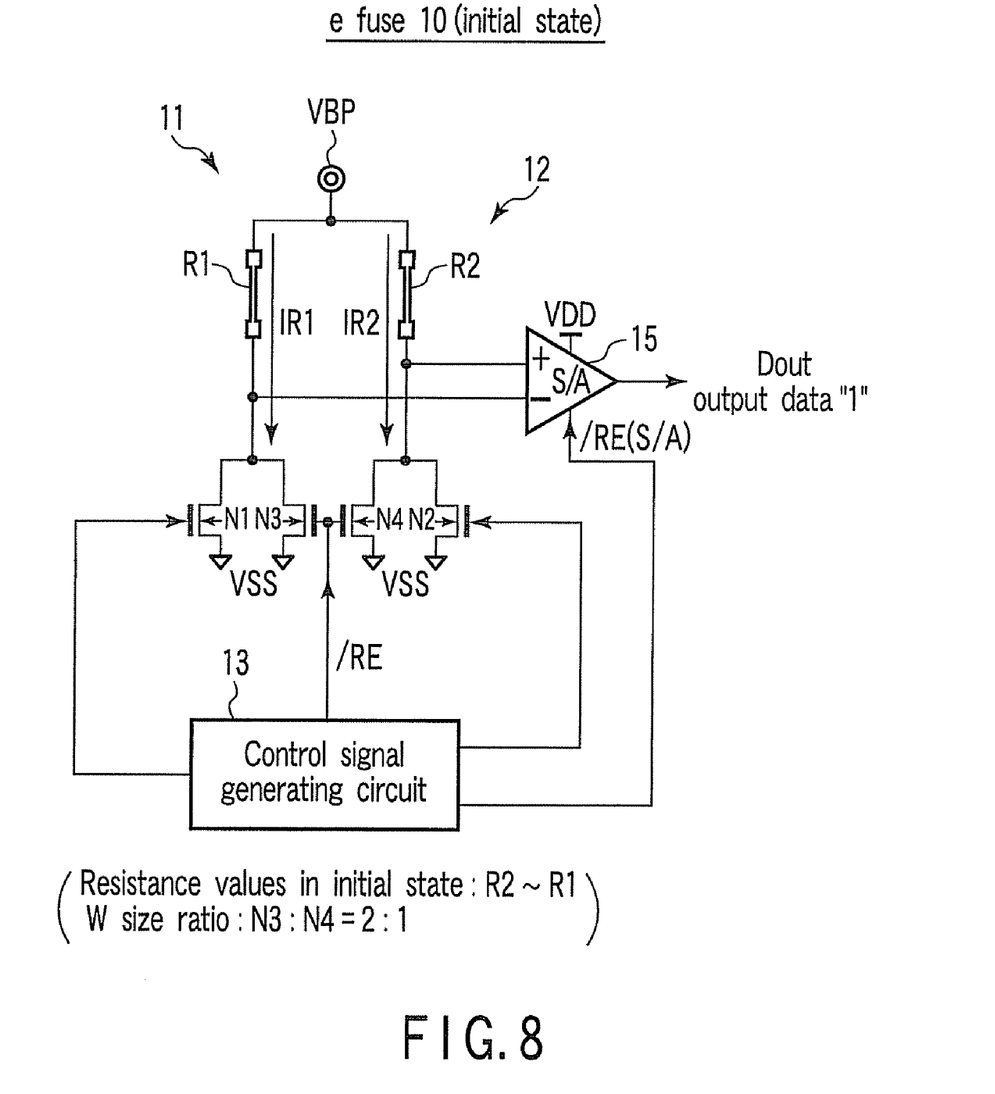
FIG. 8 is a view illustrating a read operation in an initial state of the semiconductor integrated circuit device according to the second embodiment.

Next, referring to FIG. 8, a description is given of the read operation of the eFuse 10 in the initial state according to the present embodiment. As shown in FIG. 8, in the initial state, the W size ratio between the read transistors N3 and N4 is set at 2:1 (W size ratio). On the other hand, since the first and second fuse elements R1 and R2 have substantially equal lengths, the resistance values of the fuse elements R1 and R2 in the initial state are substantially equal (resistance values: R1=R2). Accordingly, in the initial state, the resistance value of the second fuse circuit 12 is set to be greater than the resistance value of the first fuse circuit 11.

To start with, the control signal generating circuit 13 outputs the read control signal /RE to the gates of the read transistors N3 and N4, thereby turning on the read transistors N3 and N4.

Then, read currents IR1 and IR2 are caused to flow across both ends of the first and second fuse elements R1 and R2, and the read currents IR1 and IR2 are input to the sense amplifier 15.

Subsequently, the sense amplifier 15 reads a voltage difference between the first and second fuse circuits 11 and 12 from the input read currents IR1 and IR2, and outputs the output data Dout of, for example, "1" data.

<Program Operation>

Figure 9:
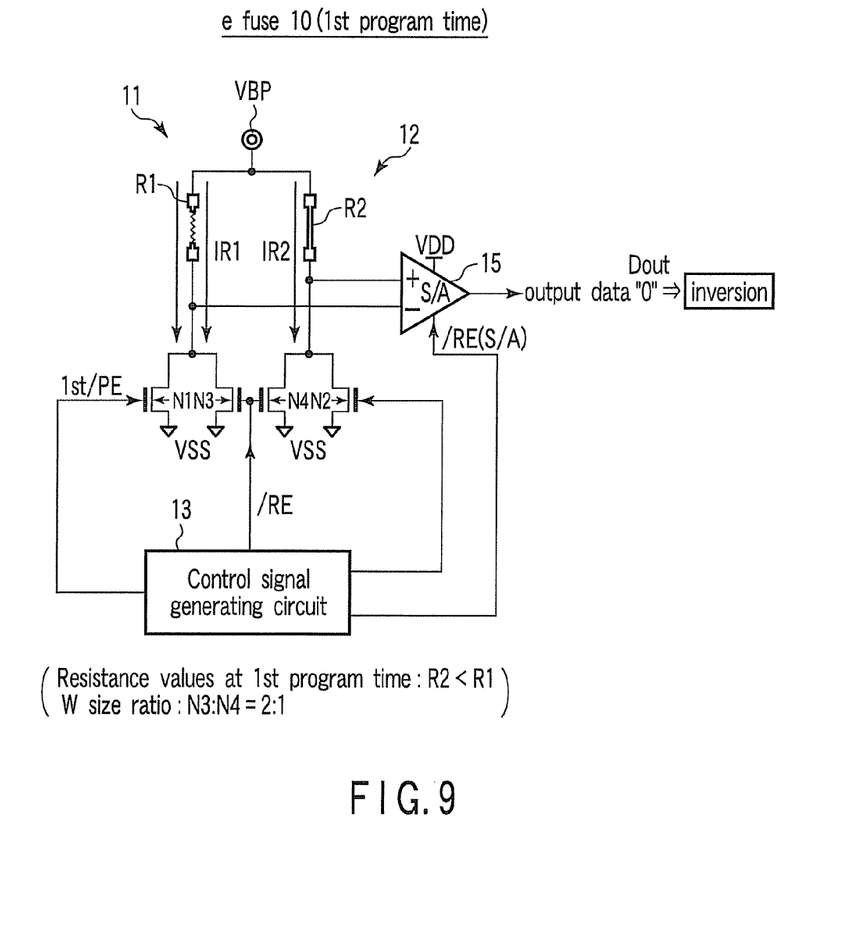
FIG. 9 is a view for explaining a first program time of the semiconductor integrated circuit device according to the second embodiment.
Figure 10:
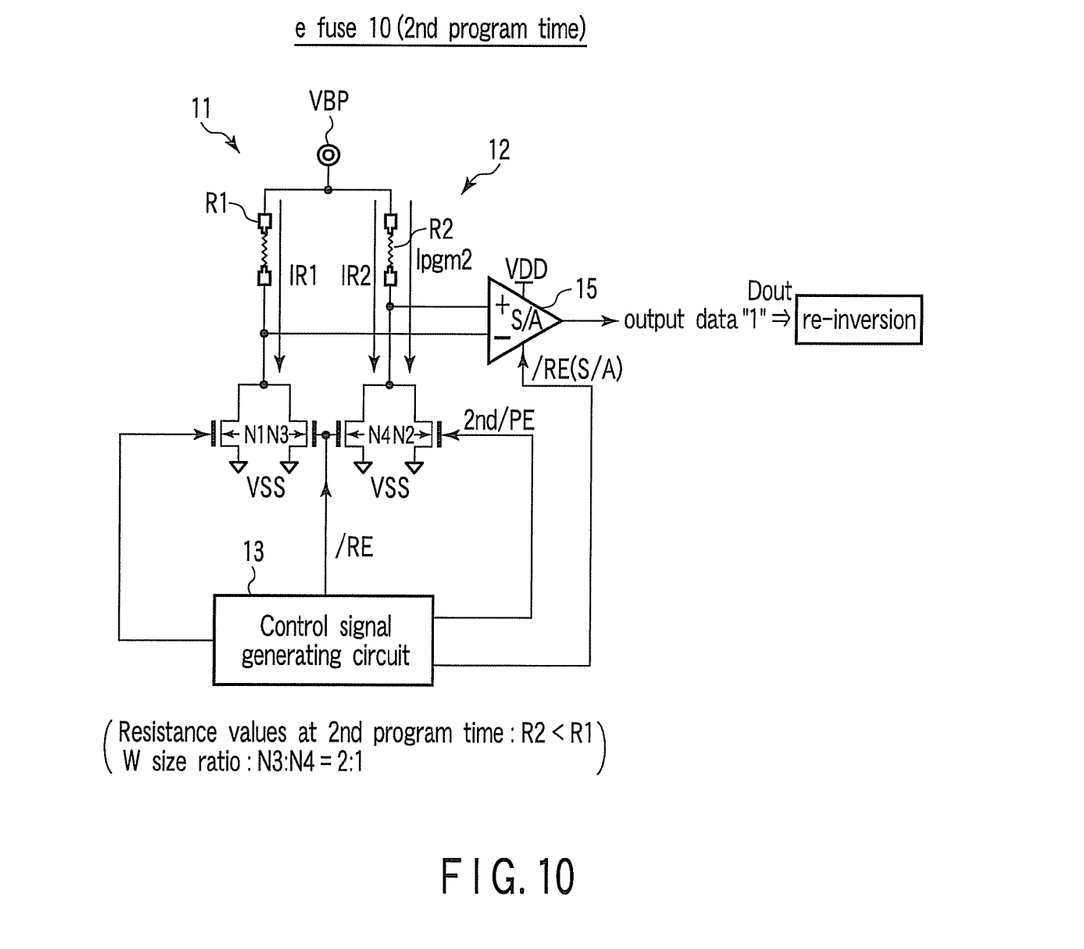
FIG. 10 is a view for explaining a second program time of the semiconductor integrated circuit device according to the second embodiment.

Next, referring to FIG. 9 and FIG. 10, a description is given of the program operation of the eFuse 10 in the initial state according to the present embodiment.

<First Program (1st Program) Operation>

To begin with, the first program (1st program) operation is described with reference to FIG. 9.

As shown in FIG. 9, to start with, the control signal generating circuit 13 sends the first control signal 1st/PE to the gate of the first write transistor N1, and turns on the first write transistor N1.

Then, the program voltage is applied to the program voltage node VBP, and the program voltage is applied across both ends of the first fuse element R1, thereby causing a program current Ipgm1 to flow, and blowing the first fuse element R1. Accordingly, at the 1st program time, the resistance value of the second fuse element R2 becomes less than the resistance value of the first fuse element R1 (resistance values: R2<R1). For example, at the 1st program time, the resistance value of the programmed first fuse element R1 is about several k$\Omega$. On the other hand, the W size ratio between the read transistors N3 and N4 is 2:1, as in the above-described initial state. Thus, at the 1st program time, the control circuit 13 can execute program such that the resistance value of the first fuse circuit 11 becomes greater than the resistance value of the second fuse circuit 12.

Subsequently, like the above-described read operation, the sense amplifier 15 reads a voltage difference between the fuse elements R1 and R2 from the read currents IR1 and IR2, and outputs the output data Dout of "0" data, which has been inverted from the initial state.

<Second Program (2nd Program) Operation>

Next, the second program (2nd program) operation is described with reference to FIG. 10.

As shown in FIG. 10, to start with, the control signal generating circuit 13 sends the second control signal 2nd/PE to the gate of the second write transistor N2, and turns on the second write transistor N2.

Then, the program voltage is applied to the program voltage node VBP, and the program voltage is applied across both ends of the second fuse element R2, thereby causing a program current Ipgm2 to flow, and blowing the second fuse element R2. Accordingly, at the 2nd program time, the resistance value of the second fuse element R2 becomes greater, once again, than the resistance value of the first fuse element R1 (resistance values: R2>R1). For example, at the 2nd program time, the resistance value of the programmed second fuse element R2 is about several-ten k$\Omega$. On the other hand, the W size ratio between the read transistors N3 and N4 is 2:1, as in the above-described initial state. Thus, at the 2nd program time, the control circuit 13 can execute reprogram such that the resistance value of the second fuse circuit 12 becomes greater than the resistance value of the first fuse circuit 11.

Subsequently, like the above-described read operation, the sense amplifier 15 reads a voltage difference between the first and second fuse circuits 11 and 12 from the read currents IR1 and IR2, and outputs the output data Dout of "1" data, which has been inverted from the state of the 1st program time.

<Advantageous Effects of Second Embodiment>

According to the semiconductor integrated circuit device of the second embodiment, at least the same advantageous effects (1) and (2) as described above can be obtained. Further, the structure of this embodiment is applicable, where necessary.

Third Embodiment

An Example in which the Semiconductor Integrated Circuit Device is Applied to a Redundancy Memory of an SRAM Next, a semiconductor memory device according to a third embodiment of the invention is described with reference to FIG. 11 to FIG. 15. This embodiment relates to an example in which the eFuse 10, which has been described in the first embodiment, is applied to a redundancy memory of an SRAM (Static Random Access Memory) and is constituted as a redundancy system. A detailed description of the parts common to those in the first embodiment is omitted.

<Structure Example of Entire Redundancy System>

Figure 11:
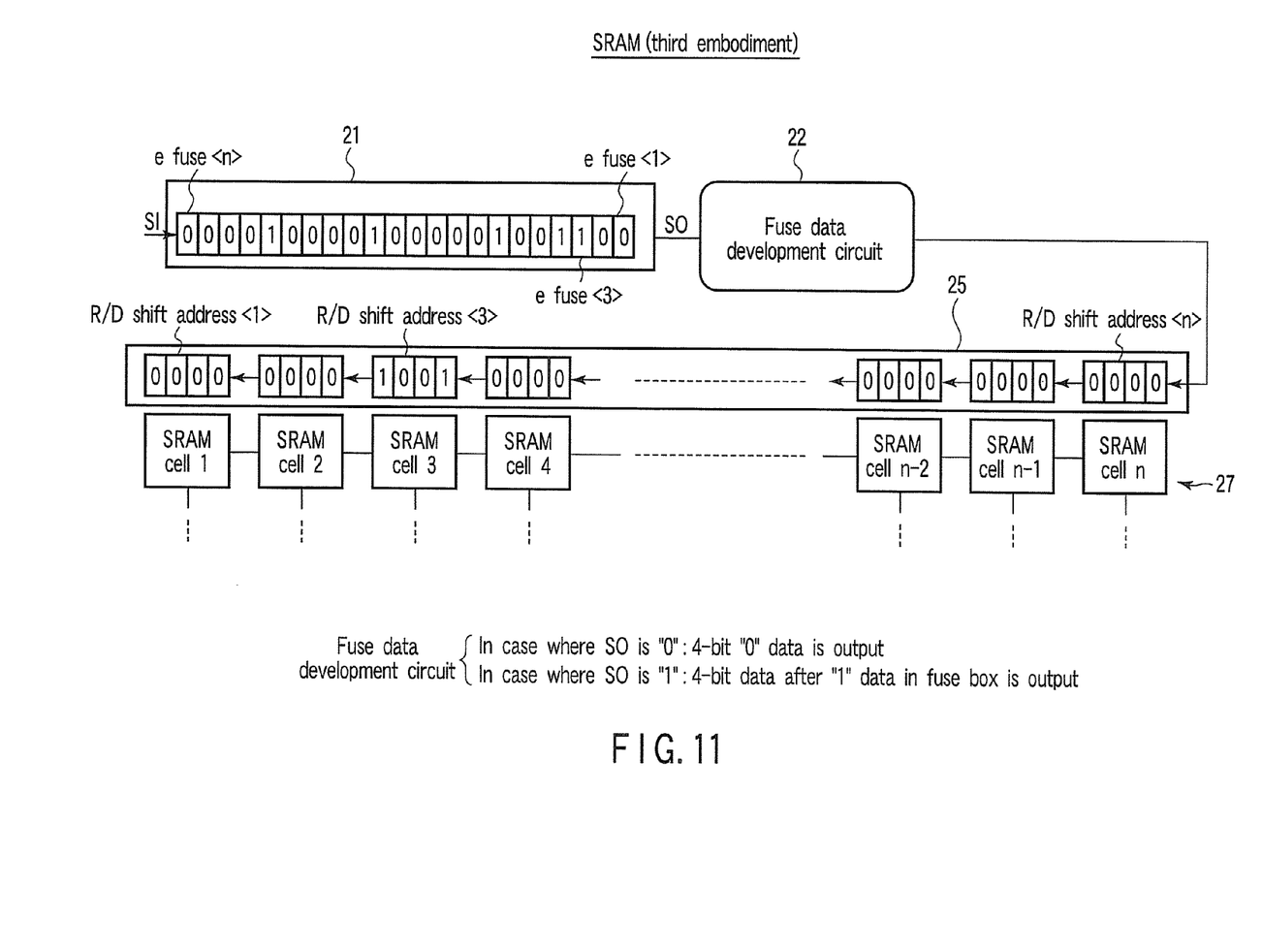
FIG. 11 is a circuit diagram showing a semiconductor integrated circuit device according to a third embodiment of the present invention.

A structure example of an entire redundancy system is described with reference to FIG. 11. As shown in FIG. 11, an SRAM according to the present embodiment comprises a memory cell array 27, a fuse box 21, a Fuse data development circuit 22 and a row decoder 25.

The memory cell array 27 includes a plurality of SRAM cells 1 to n, which are arrayed in a matrix.

Figure 12:
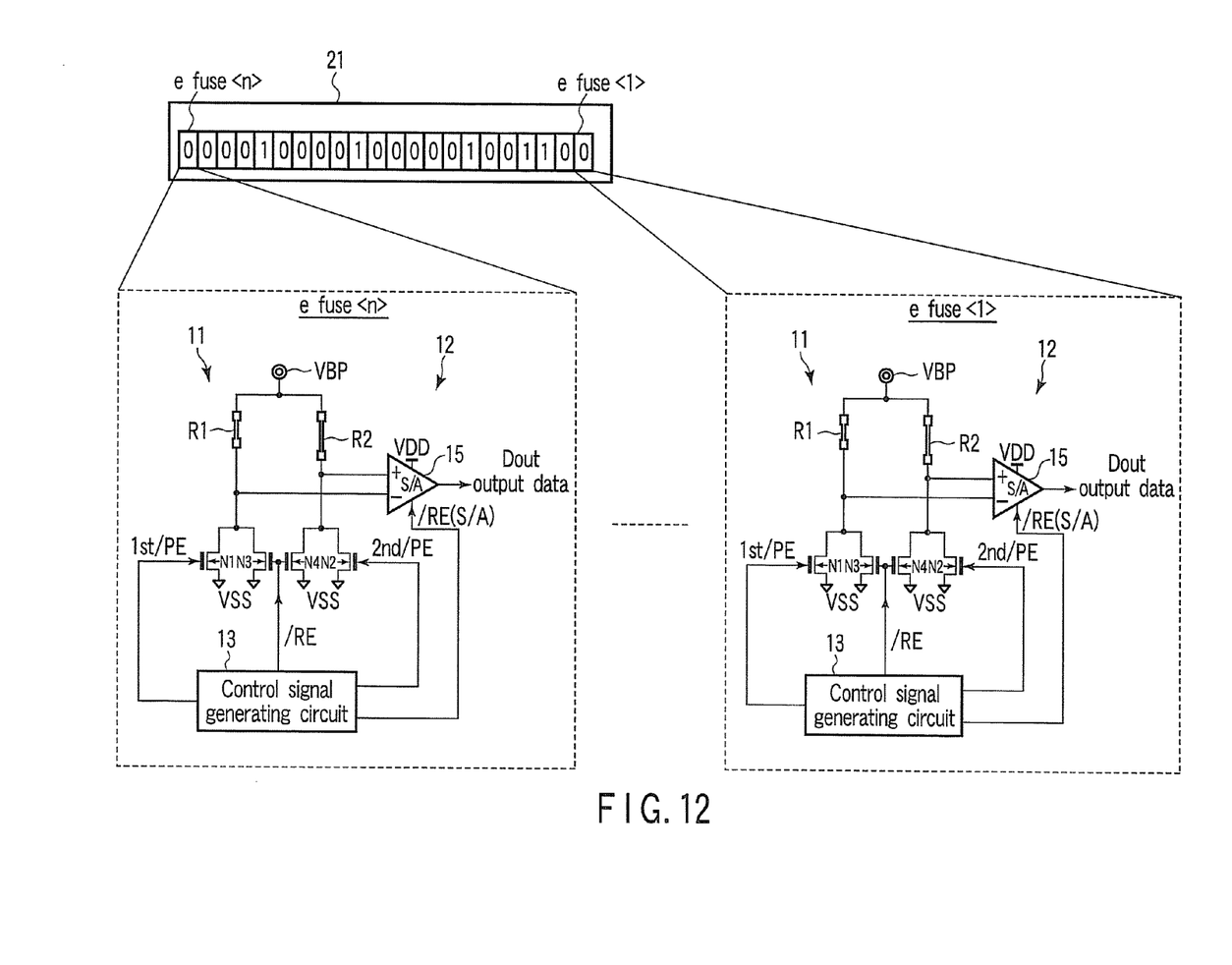
FIG. 12 is a circuit diagram for describing a fuse box of the semiconductor integrated circuit device according to the third embodiment.

The fuse box 21 includes a plurality of eFuses <1> to <n> as redundancy memories. As shown in FIG. 12, in this embodiment, each of the eFuses <1> to <n> is the eFuse 10 which has been described in connection with the first embodiment.

The eFuses <1> to <n> store "0" or "1" as defective addresses of the SRAM cell 1 to SRAM cell n. The stored data (Dout) is output to the Fuse data development circuit 22 as output serial data SO of the fuse box 21.

The Fuse data development circuit 22 executes predetermined data development of the output serial data SO which is input from the fuse box 21, and serially outputs data to the row decoder 25. The predetermined data development, in this context, is defined as follows. Specifically, in the case where the input serial data SO is "0" data, the Fuse data development circuit 22 outputs "0" data to the 4-bit ("0000") row decoder 25. By way of example, a description is given of the case in which "0" data, which is stored in the eFuse <1>, has been input as serial data SO to the Fuse data development circuit 22. In this case, since the input serial data SO is "0" data, the Fuse data development circuit 22 outputs "0" data to the 4-bit ("0000") row decoder 25.

On the other hand, in the case where the input serial data SO is "1" data, the Fuse data development circuit 22 outputs 4-bit data in the fuse box, which follows this "1" data, to the row decoder 25. By way of example, a description is given of the case in which "1" data, which is stored in the eFuse <3>, has been input as serial data SO to the Fuse data development circuit 22. In this case, since the input serial data SO is "1" data, the Fuse data development circuit 22 outputs four bits ("1001") in the fuse box, which follows this "1" data, to the row decoder 25.

The row decoder 25 stores the output of the Fuse data development circuit 22 in predetermined 4-bit-structure R/D shift addresses <1> to <n>. The R/D shift addresses <1> to <n> correspond to R/D shift addresses of the SRAM cell 1 to SRAM cell n.

An SRAM cell, in which all four bits are "0" ("0000") in the 4-bit R/D shift addresses <1> to <n>, is determined as a normal cell. For example, an SRAM cell n, in which all four bits are "0" ("0000") in an R/D shift address <n>, is determined as a normal cell. On the other hand, an SRAM cell, in which any one of all four bits is "1" in the 4-bit R/D shift addresses <1> to <n>, is determined as a defective cell. For example, an SRAM cell 3, in which 4-bit data is "1001" in an R/D shift address <3>, is determined as a defective cell.

<Redundancy Operation>

Next, a redundancy operation of the semiconductor integrated circuit device according to the present embodiment is described. The description is given with reference to a flow chart of FIG. 13.

(Step ST1 (Wafer Test 1))

Figure 13:
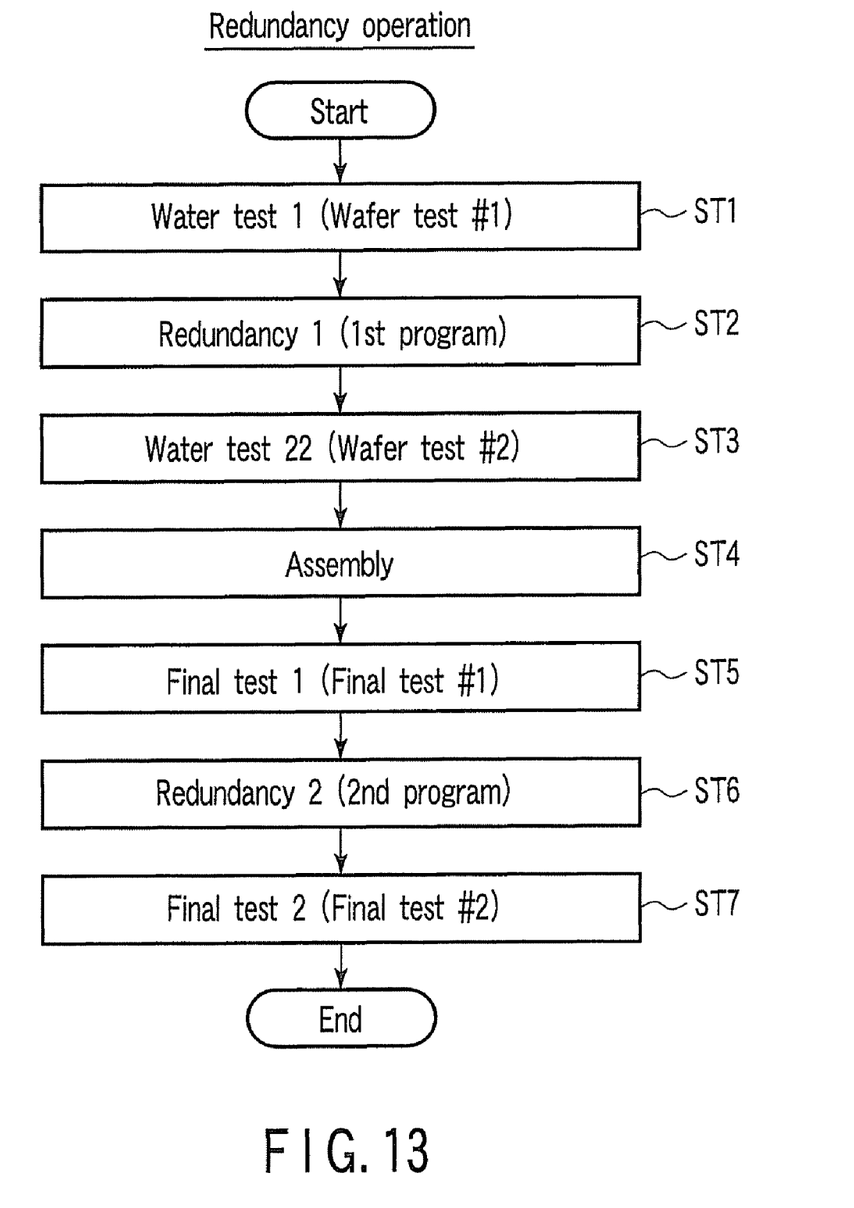
FIG. 13 is a flow chart illustrating a redundancy operation of the semiconductor integrated circuit device according to the third embodiment.

To start with, a wafer test is conducted as to whether SRAM cells 1 to n of an SRAM, which is fabricated on a silicon wafer, function normally or not. In the wafer test, an SRAM cell, which is determined as not functioning normally, is determined as a defective cell. By way of example, a description is given of the case in which the SRAM cell 3 of the R/D shift address <3> is determined as a defective cell in the wafer test.

(Step ST2 (Redundancy 1))

Subsequently, redundancy is executed to replace a defective cell, which is discovered in the above wafer test 1, with a redundancy cell (not shown) in the SRAM. For example, in the case of the present embodiment, redundancy is executed for the SRAM cell 3 of the R/D shift address <3>, which is the defective cell discovered in the test.

Figure 14:
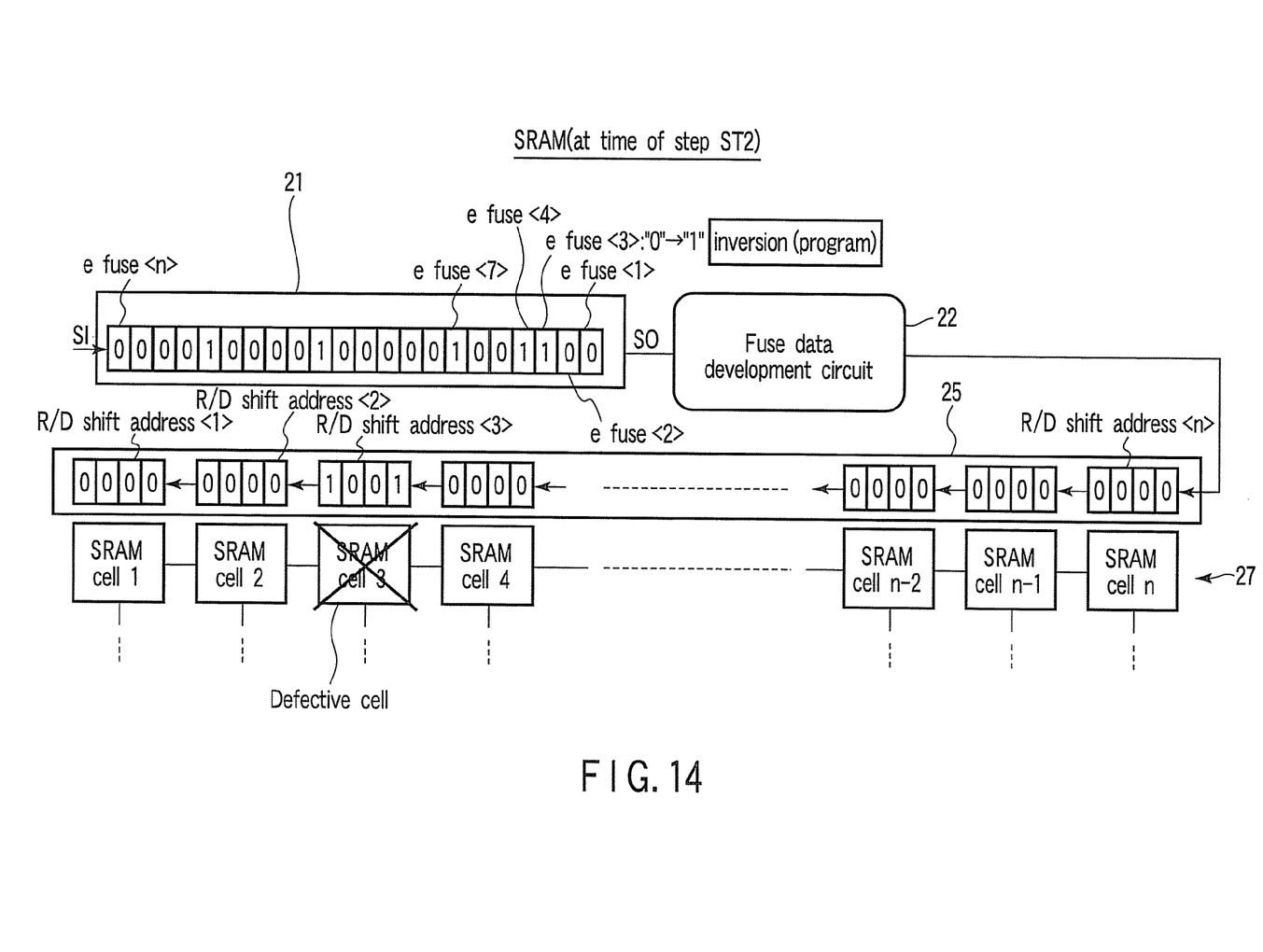
FIG. 14 is a circuit diagram for describing one step (ST2) of the redundancy operation of the semiconductor integrated circuit device according to the third embodiment.

Thus, for example, as shown in FIG. 14, a program operation is performed to invert the output data of the eFuse <3> ("0"→"1"), which corresponds to the R/D shift address <3> in the fuse box 21. To be more specific, as has been described in connection with the first embodiment, the program voltage is applied to the program voltage node VBP of the eFuse <3>, and the program voltage is applied across both ends of the first fuse element R1, thereby blowing the first fuse element R1. Accordingly, the resistance value of the second fuse element R2 becomes less than the resistance value of the first fuse element R1 (resistance values: R2<R1). Thus, at the time of this step ST2 (1st program) the control circuit 13 executes program such that the resistance value of the first fuse circuit 11 becomes greater than the resistance value of the second fuse circuit 12.

Subsequently, in order to identify the SRAM 3 as a defective cell, the same program (1st program) as described above is executed by predetermined data inversion for the 4-bit eFuse of an address following the eFuse <3>. For example, the same program inversion is executed and data inversion ("0"→"1") is executed for the output data of the eFuse <4> and eFuse <7> corresponding to the R/D shift address <4> and R/D shift address <7> in the fuse box 21.

(Step ST3 (Wafer Test 2))

Subsequently, the same wafer test as in the above step ST1 is conducted for the SRAM cells 1 to n of the SRAM.

(Step ST4 (Assembly))

Subsequently, the SRAM after the above test is diced from the silicon wafer. Then, the diced SRAM is mounted on a board.

(Step ST5 (Final Test 1))

Subsequently, a final test is conducted as to whether the SRAM cells 1 to n of the mounted SRAM function normally or not. In this final test, an SRAM cell, which is determined as not normally functioning, is determined as a defective cell. For example, in this embodiment, it is assumed that an SRAM cell 1 of the R/D shift address <1> is determined as a defective cell in this final test.

Despite the above-described wafer tests being completed, a defective cell occurs after the mounting, for the reason that some problem occurs in the mounting step of the above step ST4, and an operational defect occurs in some cases. A possible reason, for example, is an operational defect due to defective connection of a bonding wire for signals.

(Step ST6 (Redundancy 2))

Subsequently, redundancy is executed for a defective cell, which is discovered in the above final test 1. For example, in the case of the present embodiment, redundancy is executed for the SRAM cell 1 of the R/D shift address <1>, which is the defective cell discovered in the test.

Figure 15:
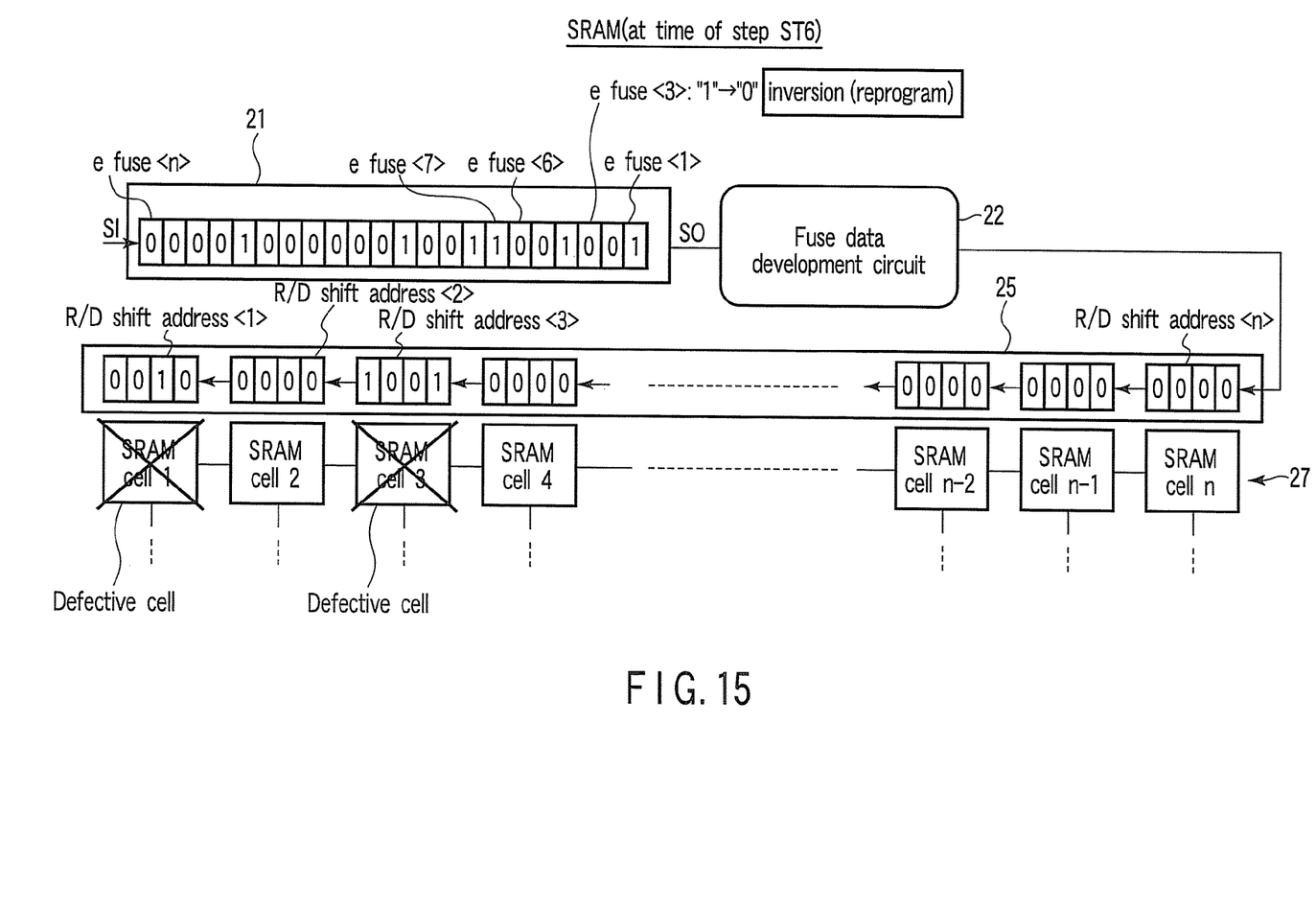
FIG. 15 is a circuit diagram for describing one step (ST6) of the redundancy operation of the semiconductor integrated circuit device according to the third embodiment.

Thus, for example, as shown in FIG. 15, the same program as described above is executed to invert the output data of the eFuse <1> ("0"→"1"), which corresponds to the R/D shift address <1> in the fuse box 21.

Further, in order to identify the SRAM 1 as a defective cell, program (1st program) by data inversion or reprogram (2nd program) by data re-inversion is executed for the 4-bit eFuse of an address following the eFuse <1>. For example, a reprogram operation is executed to invert the output data of the eFuse <3> ("1"→"0"), which corresponds to the R/D shift address <3> in the fuse box 21.

To be more specific, the program voltage is applied to the program voltage node VBP, and the program voltage is applied across both ends of the second fuse element R2, thereby blowing the second fuse element R2. Accordingly, in the step ST6 (2nd program), the resistance value of the second fuse element R2 becomes greater, once again, than the resistance value of the first fuse element R1 (resistance values: R2>R1). Thus, at the time of this step ST6, the control circuit 13 executes reprogram such that the resistance value of the second fuse circuit 12 becomes greater than the resistance value of the first fuse circuit 11.

Subsequently, on the basis of the result of the final test 1 (ST5), the same program or reprogram is executed for the eFuse in the fuse box 21.

(Step ST7 (Final Test 2))

Subsequently, a final test is further conducted as to whether the SRAM cells 1 to n of the SRAM function normally or not.

<Advantageous Effects of Third Embodiment>

According to the semiconductor integrated circuit device and the redundancy method of the third embodiment, at least the same advantageous effects (1) and (2) as described above can be obtained. Further, according to the third embodiment, at least the following advantageous effect (3) can be obtained.

(3) The yield can be improved.

As described above, according to the structure and operation of the present embodiment, even after redundancy is once executed for a defective cell which is discovered in wafer test 1 (after ST2), redundancy (ST6) can be executed once again for a defective cell which is discovered in final test 1 (reprogram can be executed for the same eFuse 10 (the same bit)).

For example, as shown in FIG. 15, in order to identify the SRAM 1 as a defective cell, the reprogram operation is executed to invert the output data of the eFuse <3> ("1"→"0"), which corresponds to the R/D shift address <3> of the address following the eFuse <1>. To be more specific, the program voltage is applied to the program voltage node VBP, and the program voltage is applied across both ends of the second fuse element R2, thereby blowing the second fuse element R2. Accordingly, in the step ST6 (2nd program), the resistance value of the second fuse element R2 becomes greater, once again, than the resistance value of the first fuse element R1 (resistance values: R2>R1). Thus, at the time of this step ST6, the control circuit 13 executes reprogram such that the resistance value of the second fuse circuit 12 becomes greater than the resistance value of the first fuse circuit 11.

Despite the above-described wafer tests being completed, a defective cell may occur after the mounting, for the reason that some problem, such as defective connection of a bonding wire for signals, occurs in the mounting step of the above step ST4, and an operational defect occurs in some cases.

As has been described above, according to the present embodiment, even if a defective cell occurs after the mounting, such a defective cell can be remedied, and the yield of SRAMs can advantageously be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a first fuse circuit including a first fuse element and a first write transistor which has a current path with one end connected to one end of the first fuse element;
a second fuse circuit including a second fuse element and a second write transistor which has a current path with one end connected to one end of the second fuse element, the second fuse circuit being configured such that a resistance value of the second fuse element is greater than a resistance value of the first fuse element and thereby a resistance value of the second fuse circuit is greater than a resistance value of the first fuse circuit; and
a control signal generating circuit which sends a first control signal to a control terminal of the first write transistor and executes program such that the resistance value of the first fuse circuit becomes greater than the resistance value of the second fuse circuit, and sends a second control signal to a control terminal of the second write transistor and executes reprogram such that the resistance value of the second fuse circuit becomes greater than the resistance value of the first fuse circuit.

2. The circuit according to claim 1, wherein the first fuse circuit further comprises a first read transistor which has a current path with one end connected to said one end of the first fuse element, and
the second fuse circuit further comprises a second read transistor which has a current path with one end connected to said one end of the second fuse element.

3. The circuit according to claim 2, wherein the control signal generating circuit sends a read control signal to control terminals of the first and second read transistors.

4. The circuit according to claim 1, wherein each of the first and second fuse elements is a blow-type fuse element, and is formed to include polysilicon or a metal.

5. The circuit according to claim 1, further comprising a sense amplifier having a first input connected to said one end of the first fuse element, a second input connected to said one end of the second fuse element, and a control terminal to which an internal power supply voltage is applied, the sense amplifier reading a voltage difference between the first and second fuse elements and executing determination.

6. The circuit according to claim 1, further comprising a fuse data development circuit which executes data development of data which is input from the semiconductor integrated circuit device, and serially outputs the data to outside.

7. The circuit according to claim 6, further comprising a row decoder which stores an output from the fuse data development circuit.

* * * * *